(12) United States Patent
Olieman et al.

(10) Patent No.: US 10,958,282 B2
(45) Date of Patent: Mar. 23, 2021

(54) CAPACITIVE SAMPLING CIRCUIT

(71) Applicant: NXP B.V., Eindhoven (NL)

(72) Inventors: Erik Olieman, Waalre (NL); Alphons Litjes, Zijtaart (NL); Leon van der Dussen, Nuenen (NL)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 16/813,823

(22) Filed: Mar. 10, 2020

(65) Prior Publication Data
US 2020/0313689 A1    Oct. 1, 2020

(30) Foreign Application Priority Data

Mar. 27, 2019  (EP) ...................................... 19165614

(51) Int. Cl.
*H03M 1/12*        (2006.01)
*H03M 1/46*        (2006.01)

(52) U.S. Cl.
CPC ......... *H03M 1/462* (2013.01); *H03M 1/1295* (2013.01); *H03M 1/468* (2013.01)

(58) Field of Classification Search
CPC ..... H03M 1/462; H03M 1/1295; H03M 1/468
USPC .................. 341/163, 155, 172, 144
See application file for complete search history.

(56) References Cited

U.S. PATENT DOCUMENTS 4,803,462 A * 2/1989 Hester ................. H03M 1/0682
                                                    341/172
7,741,981 B1 * 6/2010 Wan ........................ H03M 1/02
                                                    341/110
8,031,099 B2 * 10/2011 Zhao ................... H03M 1/1033
                                                    341/150
8,581,770 B2   11/2013 Wang et al.
8,860,600 B1   10/2014 Yang
(Continued)

FOREIGN PATENT DOCUMENTS

CN       105007079 A    10/2015
TW        I330931 B     5/2008

OTHER PUBLICATIONS

Nicollini et al., "A fully differential sample-and-hold circuit for high-speed applications," in IEEE Journal of Solid-State Circuits, vol. 24, No. 5, pp. 1461-1465, Oct. 1989.
(Continued)

*Primary Examiner* — Peguy Jean Pierre (57) ABSTRACT

A capacitive sampling circuit comprises: a first-differential-input-terminal, configured to receive a first one of a pair of differential-input-signals; a second-differential-input-terminal, configured to receive the other one of the pair of differential-input-signals; a capacitive-circuit-output-terminal, configured to provide a sampled-output-signal; a plurality of first-sampling-capacitors, each having a first-plate and a second-plate; a plurality of reference-voltage-terminals, each configured to receive a respective reference-voltage; and a first-capacitor-first-plate-switching-block configured to selectively connect the first-plate of each of the plurality of first-sampling-capacitors to either: (i) the first-differential-input-terminal; or (ii) a respective one of the plurality of reference-voltage-terminals; and a first-capacitor-second-plate-switch, configured to selectively connect or disconnect the second-plate of each of the plurality of first-sampling-capacitors to the second-differential-input-terminal.

13 Claims, 3 Drawing Sheets

(56) References Cited

U.S. PATENT DOCUMENTS

2007/0115159 A1\* 5/2007 Tachibana ........... H03M 1/1023
 341/144
2016/0006450 A1\* 1/2016 Chen ....................... H03M 1/06
 341/120

OTHER PUBLICATIONS

Promitzer, Gilbert "12-bit low-power fully differential switched capacitor noncalibrating successive approximation ADC with 1 MS/s," in IEEE Journal of Solid-State Circuits, vol. 36, No. 7, pp. 1138-1143, Jul. 2001.

\* cited by examiner

Figure 5

CAPACITIVE SAMPLING CIRCUIT

FIELD

The present disclosure relates to capacitive sampling circuits, and in particular although not exclusively to successive approximation register (SAR) analogue-to-digital converters (ADCs) that include capacitive sampling circuits.

SUMMARY

According to a first aspect of the present disclosure there is provided a circuit comprising a capacitive sampling circuit, wherein the capacitive sampling circuit comprises:

a first-differential-input-terminal, configured to receive a first one of a pair of differential-input-signals;

a second-differential-input-terminal, configured to receive the other one of the pair of differential-input-signals;

a capacitive-circuit-output-terminal, configured to provide a sampled-output-signal;

a plurality of first-sampling-capacitors, each having a first-plate and a second-plate;

a plurality of reference-voltage-terminals, each configured to receive a respective reference-voltage;

a first-capacitor-first-plate-switching-block configured to selectively connect the first-plate of each of the plurality of first-sampling-capacitors to either: (i) the first-differential-input-terminal; or (ii) a respective one of the plurality of reference-voltage-terminals; and a first-capacitor-second-plate-switch, configured to selectively connect or disconnect the second-plate of each of the plurality of first-sampling-capacitors to the second-differential-input-terminal.

Such a capacitive sampling circuit can perform fully differential capacitive sampling, which can advantageously reduce any common mode noise that is sampled across the first-sampling-capacitors.

In one or more embodiments, the circuit further comprises a controller configured to control the first-capacitor-first-plate-switching-block and the first-capacitor-second-plate-switch, in order to alternate between:

(a) a sampling-state-of-operation, in which:
   the first-capacitor-first-plate-switching-block connects the first-plate of each of the plurality of first-sampling-capacitors to the first-differential-input-terminal; and
   the first-capacitor-second-plate-switch connects the second-plate of each of the plurality of first-sampling-capacitors to the second-differential-input-terminal; and (b) a conversion-state-of-operation, in which:
   the first-capacitor-first-plate-switching-block connects the first-plate of each of the plurality of first-sampling-capacitors to a respective one of the plurality of reference-voltage-terminals; and
   the first-capacitor-second-plate-switch disconnects the second-plate of each of the plurality of first-sampling-capacitors from the second-differential-input-terminal.

In one or more embodiments, the circuit is a digital-to-analogue converter circuit. The circuit may be an analogue-to-digital converter circuit.

In one or more embodiments, the circuit is an SAR ADC circuit. The SAR ADC may further comprise one or more of:

a first capacitive sampling circuit comprising any capacitive sampling circuit disclosed herein;

a comparator comprising a comparator-first-input-terminal and a comparator-output-terminal; and a SAR-logic-block comprising:
   a SAR-logic-input-terminal that is configured to receive a comparator-output-signal;
   a SAR-logic-feedback-terminal that is configured to provide a SAR-logic-feedback-signal that is representative of a digital word for supplying as a reference to the first capacitive sampling circuit. The digital word may comprise a plurality of bits. The SAR-logic-block may be configured to process the comparator-output-signal in order to determine the SAR-logic-feedback-signal; and
   a SAR-logic-output-terminal that is configured to provide an ADC-output-signal that is representative of the digital word at an end of conversion;

The capacitive-circuit-output-terminal of the first capacitive sampling circuit may be connected to the comparator-first-input-terminal of the comparator. The comparator-output-terminal of the comparator may be connected to the SAR-logic-input-terminal. The SAR-logic-feedback-terminal may be connected to the plurality of reference-voltage-terminals of the first capacitive sampling circuit. Each of the plurality of reference-voltage-terminals may be configured to receive a respective reference-voltage that represents the value of one of the bits in the digital word.

In one or more embodiments, the circuit further comprises: a plurality of buffers that are connected in series between the SAR-logic-feedback-terminal and the plurality of reference-voltage-terminals of the first capacitive sampling circuit.

In one or more embodiments, the circuit may further comprise:

one or more first-dummy-capacitors, each having a first-dummy-capacitor-first-plate and a first-dummy-capacitor-second-plate, wherein the first-dummy-capacitor-second-plate is connected to the comparator-first-input-terminal; and a first-dummy-capacitor-switching-block configured to selectively connect the first-dummy-capacitor-first-plate of each of the one or more first-dummy-capacitors to either: (i) the first-differential-input-terminal; or (ii) a ground-terminal.

In one or more embodiments, when the circuit is in a conversion-state-of-operation, the first-dummy-capacitor-switching-block connects the first-dummy-capacitor-first-plate of each of the one or more first-dummy-capacitors to the ground-terminal; and when the circuit is in a sampling-state-of-operation, the first-dummy-capacitor-switching-block connects the first-dummy-capacitor-first-plate of each of the one or more first-dummy-capacitors to the first-differential-input-terminal.

In one or more embodiments, the circuit further comprises: a second capacitive sampling circuit comprising any capacitive sampling circuit disclosed herein. The first-differential-input-terminal of the first capacitive sampling circuit may be configured to receive a first-differential-input-signal. The second-differential-input-terminal of the first capacitive sampling circuit may be configured to receive a second-differential-input-signal. The first-differential-input-terminal of the second capacitive sampling circuit may be configured to receive the second-differential-input-signal. The second-differential-input-terminal of the second capacitive sampling circuit may be configured to receive the first-differential-input-signal. The comparator may further comprise a comparator-second-input-terminal. The capacitive-circuit-output-terminal of the second capacitive sampling circuit may be connected to the comparator-second-input-terminal of the comparator. The SAR-logic-feedback-terminal may be connected to the plurality of reference-voltage-terminals of the second capacitive sampling circuit. Each of the plurality of reference-voltage-terminals may be configured to receive a respective reference-voltage that represents the value of one of the bits in the digital word.

In one or more embodiments, the circuit further comprises: a plurality of buffers that are connected in series between the SAR-logic-feedback-terminal and the plurality of reference-voltage-terminals of the second capacitive sampling circuit.

In one or more embodiments, the circuit further comprises: one or more second-dummy-capacitors, each having a second-dummy-capacitor-first-plate and a second-dummy-capacitor-second-plate. The second-dummy-capacitor-second-plate may be connected to the comparator-second-input-terminal. A second-dummy-capacitor-switching-block may be configured to selectively connect the second-dummy-capacitor-first-plate of each of the one or more second-dummy-capacitors to either: (i) the second-differential-input-terminal; or (ii) a ground-terminal.

In one or more embodiments, when the SAR ADC is in a conversion-state-of-operation, the second-dummy-capacitor-switching-block connects the second-dummy-capacitor-first-plate of each of the one or more second-dummy-capacitors to the ground-terminal; and when the SAR ADC is in a sampling-state-of-operation, the second-dummy-capacitor-switching-block connects the second-dummy-capacitor-first-plate of each of the one or more second-dummy-capacitors to the second-differential-input-terminal.

In one or more embodiments, the first-differential-input-signal is a positive-differential-input-signal; and the second-differential-input-signal is a negative-differential-input-signal.

In one or more embodiments, the first-differential-input-signal is a negative-differential-input-signal; and the second-differential-input-signal is a positive-differential-input-signal.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

A successive approximation analogue-to-digital converter (ADC) is a type of analogue-to-digital converter that uses a successive approximation register (SAR) to convert an analogue waveform into a digital output signal. Sampling on SAR ADCs can occur on either on the bottom plate or on the top plate of sampling capacitors that are present in a digital-to-analogue converter (DAC) of the overall SAR ADC circuit.

Figure 1:
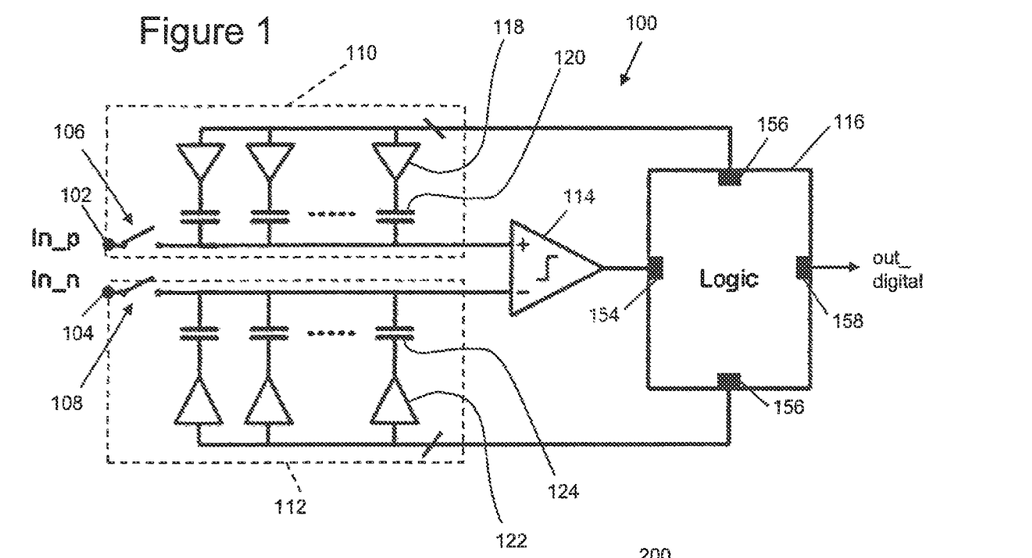
FIG. 1 shows a SAR ADC that performs top plate sampling of received differential signalling.

FIG. 1 shows a SAR ADC 100 that performs top plate sampling of received differential signalling.

The SAR ADC 100 includes a first-DAC 110, a second-DAC 112, a comparator 114 and a SAR-logic-block 116. As will be discussed in detail below, each of the first-DAC 110 and the second DAC 112 include a capacitive sampling circuit. The SAR ADC 100 has a first-differential-input-terminal 102 that receives a first-differential-input-signal (in_p), which in this example is a positive-differential-input-signal. The SAR ADC 100 also includes a second-differential-input-terminal 104 that receives a second-differential-input-signal (in_n), which in this example is a negative-differential-input-signal.

The first-differential-input-terminal 102 is connected to a positive-input-terminal of the comparator 114 by a first-sampling-switch 106. In this way, the first-sampling-switch 106 can selectively connect or disconnect the first-differential-input-terminal 102 to the comparator 114 (and also to a plurality of first-sampling-capacitors 120, as will be discussed below). When the first-sampling-switch 106 is closed, the circuit samples the first-differential-input-signal (in_p). When the first-sampling-switch 106 is open, the circuit converts the sampled value of the first-differential-input-signal (in_p). Also connected to the positive-input-terminal of the comparator 114 is the first-DAC 110. More particularly, the analogue output signal from the first-DAC 110 is provided to the positive-input-terminal of the comparator 114.

In a similar way, the second-differential-input-terminal 104 is connected to a negative-input-terminal of the comparator 114 by a second-sampling-switch 108. In this way, the second-sampling-switch 108 can selectively connect or disconnect the second-differential-input-terminal 104 to the comparator 114 (and also to a plurality of second-sampling-capacitors 124, as will be discussed below). When the second-sampling-switch 108 is closed, the circuit samples the second-differential-input-signal (in_n). When the second-sampling-switch 108 is open, the circuit converts the sampled value of the second-differential-input-signal (in_n). Also connected to the negative-input-terminal of the comparator 114 is the second-DAC 112. More particularly, the analogue output signal from the second-DAC 112 is provided to the negative-input-terminal of the comparator 114.

The comparator 114 has a comparator-output-terminal that is connected to a SAR-logic-input-terminal 154 of the SAR-logic-block 116. The SAR-logic-input-terminal 154 receives a comparator-output-signal from the comparator 114. The SAR-logic-block 116 also includes a SAR-logic-feedback-terminal 156 (shown as two separate terminals in FIG. 1 for clarity) and a SAR-logic-output-terminal 158. The SAR-logic-feedback-terminal 156 is configured to provide a SAR-logic-feedback-signal that is representative of a digital word for supplying as a reference to the first-DAC 110 and the second-DAC 112. The digital word comprises a plurality of bits. The SAR-logic-block 116 processes the comparator-output-signal in order to determine the SAR-logic-feedback-signal, as is known in the art. The SAR-logic-output-terminal 158 provides an ADC-output-signal (out-digital) that is representative of the digital code at an end of the analogue to digital conversion, again as known in the art of SAR ADCs.

The first-DAC 110 includes a plurality of first-sampling-capacitors 120 and a corresponding plurality of first-buffers 118, which may also be referred to as inverters. Each respective pair of a first-sampling-capacitor 120 and a first-buffer 118 is connected (in series with each other) between (i) the SAR-logic-feedback-terminal 156; and (ii) the positive-input-terminal of the comparator 114. More particularly, each respective pair of a first-sampling-capacitor 120 and a first-buffer 118 is connected to the SAR-logic-feedback-terminal 156 such that it receives a respective reference-voltage that represents a bit value of the digital word that is provided as a SAR-logic-feedback-signal by the SAR-logic-block 116.

Similarly, the second-DAC 112 includes a plurality of second-sampling-capacitors 124 and a corresponding plurality of second-buffers 122. Each respective pair of a second-sampling-capacitor 124 and a second-buffer 122 is connected (in series with each other) between (i) the SAR-logic-feedback-terminal 156; and (ii) the negative-input-terminal of the comparator 114. As with the first-DAC 110, each respective pair of a second-sampling-capacitor 124 and a second-buffer 122 receives a respective reference-voltage that represents a bit value of the digital word that is provided as a SAR-logic-feedback-signal.

Figure 2:
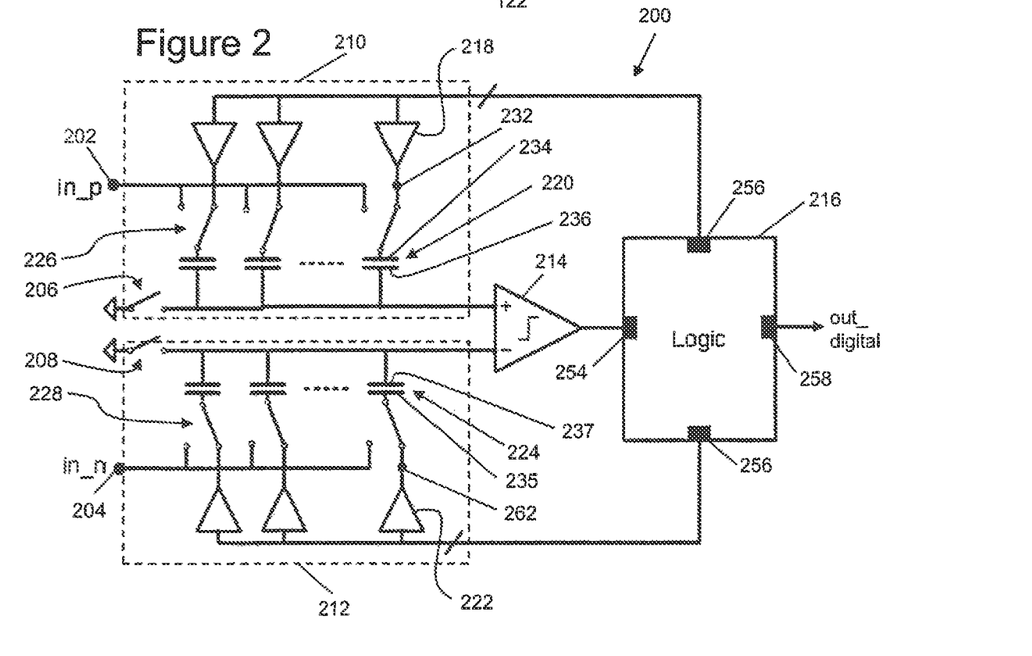
FIG. 2 shows a SAR ADC that performs bottom plate sampling of received differential signalling.

The SAR ADC 100 of FIG. 1 performs top plate sampling of the received differential signalling because the first-differential-input-signal (in_p) and the second-differential-input-signal (in_n) are connected to the top plates of the sampling-capacitors 120, 124. The differential input signalling (in_n and in_p) is sampled pseudo-differentially on the DACs FIG. 2 shows a SAR ADC 200 that performs bottom plate sampling of received differential signalling. Features of FIG. 2 that have already been described with reference to FIG. 1 will be given corresponding features in the 200 series, and will not necessarily be described again here.

The circuit of FIG. 2 includes a plurality of first-reference-voltage-terminals 232 and a plurality of second-reference-voltage-terminals 262, which each receive a respective reference-voltage. Each of the respective reference-voltages represents the value of one of the bits in the digital word that is provided as a SAR-logic-feedback-signal by the SAR-logic-block 216. In this way, the SAR-logic-block applies a digital word across both the plurality of first-reference-voltage-terminals 232 and the plurality of second-reference-voltage-terminals 262.

The circuit of FIG. 2 also includes a first-capacitor-first-plate-switching-block 226, which can selectively connect a first-plate 234 of each of the plurality of first-sampling-capacitors 220 to either: (i) the first-differential-input-terminal 202; or (ii) a respective one of the plurality of first-reference-voltage-terminals 232. Similarly, the circuit includes a second-capacitor-first-plate-switching-block 228, which can selectively connect a first-plate 235 of each of the plurality of second-sampling-capacitors 224 to either: (i) the second-differential-input-terminal 204; or (ii) a respective one of the plurality of second-reference-voltage-terminals 262.

The positive-input-terminal of the comparator 214 is connected to ground by a first-sampling-switch 206. In this way, the first-sampling-switch 206 can selectively connect or disconnect the comparator 214 (and also the plurality of first-sampling-capacitors 220) to ground. Similarly, the negative-input-terminal of the comparator 214 is connected to ground by a second-sampling-switch 208. In this way, the second-sampling-switch 208 can selectively connect or disconnect the comparator 214 (and also the plurality of second-sampling-capacitors 224) to ground.

The SAR ADC 200 is in a conversion-state-of-operation (as shown in FIG. 2) when:
    the first-capacitor-first-plate-switching-block 226 connects the first-plate 234 of each of the plurality of first-sampling-capacitors 220 to a respective one of the plurality of first-reference-voltage-terminals 232;
    the second-capacitor-first-plate-switching-block 228 connects the first-plate 235 of each of the plurality of second-sampling-capacitors 224 to a respective one of the plurality of second-reference-voltage-terminals 262;
    the first-sampling-switch 206 disconnects the positive-input-terminal of the comparator 214 from ground; and
    the second-sampling-switch 208 disconnects the negative-input-terminal of the comparator 214 from ground.

The SAR ADC 200 is in a sampling-state-of-operation (not shown in FIG. 2) when:
    the first-capacitor-first-plate-switching-block 226 connects the first-plate 234 of each of the plurality of first-sampling-capacitors 220 to the first-differential-input-terminal 202;
    the second-capacitor-first-plate-switching-block 228 connects the first-plate 235 of each of the plurality of second-sampling-capacitors 224 to the second-differential-input-terminal 204;
    the first-sampling-switch 206 connects the positive-input-terminal of the comparator 214 to ground; and
    the second-sampling-switch 208 connects the negative-input-terminal of the comparator 214 to ground.

The SAR ADC 200 of FIG. 2 performs bottom plate sampling of the received differential signalling because the first-differential-input-signal (in_p) and the second-differential-input-signal (in_n) are connected to the bottom plates (first-plates 234, 235) of the sampling-capacitors 220, 224. The differential input signalling (in_n and in_p) is again sampled pseudo-differentially on the DACs, although on the other side of the sampling-capacitors when compared with the circuit of FIG. 1.

As discussed above, the differential input signalling is sampled pseudo-differentially on the DACs for both the top plate sampling of FIG. 1 and the bottom plate sampling of FIG. 2. In a pseudo-differential setup, the even order distortion components will be common mode. These common mode distortion components can be suppressed using downstream processing, for example in a similar way to a fully differential setup. Therefore, such pseudo-differential circuits just shift the problem to the next stage. In contrast, a fully differential setup would cancel (or at least reduce) the common mode signal, irrespective of the source (crosstalk, distortion components, bias shifting, etc).

For the SAR ADC of FIG. 1, the stage after the DACs is a comparator. While a comparator can be fully differential, and so would reject common mode signals, there are still reasons to want a fully differential DAC (which includes the sampling-capacitors in a SAR ADC). These reasons include:

1. Comparators have limited common mode rejection ratio (CMRR). This means unwanted common mode signals can propagate to the output of the ADC, thereby limiting performance. Therefore, extra CMRR can be useful, especially since increasing the CMRR of a dynamic comparator can increase the power consumption of the circuit.
2. Comparators can have a limited common mode range. A comparator with an NMOS input stage can, on its low end, be limited by its threshold voltage (which in modern CMOS can easily be half the supply voltage). Also, at its high end, overvoltage can occur during conversion. Therefore, performance can rapidly drop with increasing common mode voltage.

So, overall it can be useful to reject common mode signals in a SAR ADC before the comparator.

Figure 3A:
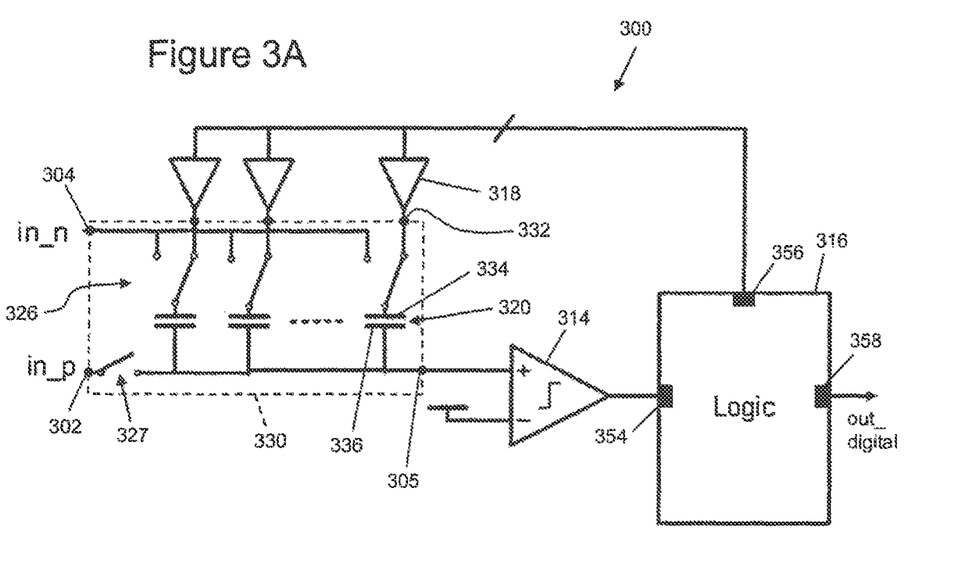
FIGS. 3A and 3B show a SAR ADC that includes a capacitive sampling circuit according to an example embodiment of the disclosure.
Figure 3B:
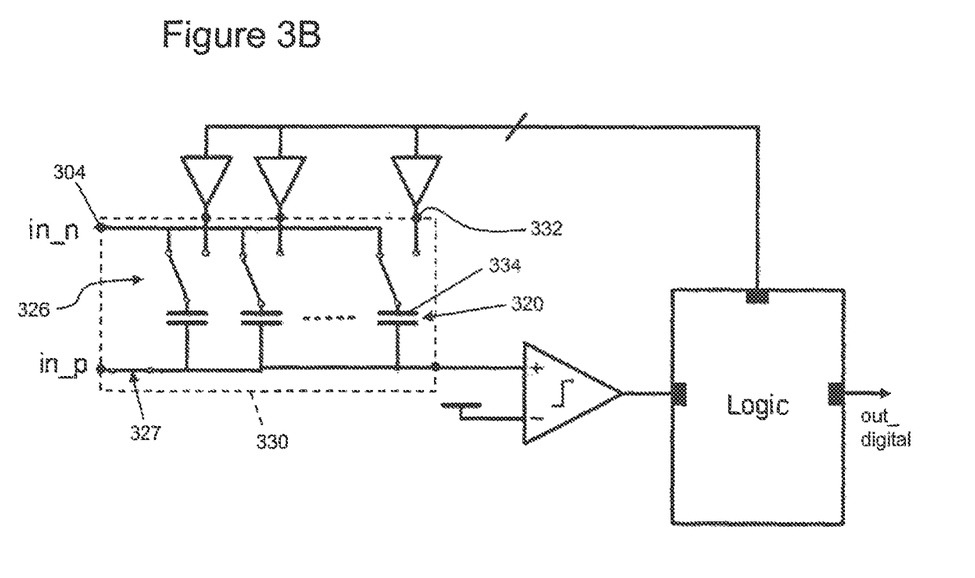

FIGS. 3A and 3B show a SAR ADC 300, which includes a capacitive sampling circuit 330 according to an example embodiment of the disclosure. FIG. 3A shows the SAR ADC 300 in a conversion-state-of-operation. FIG. 3B shows the SAR ADC 300 in a sampling-state-of-operation. Features of FIGS. 3A and 3B that have already been described with reference to FIG. 1 or FIG. 2 will be given corresponding features in the 300 series, and will not necessarily be described again here.

The capacitive sampling circuit 330 receives a pair of differential-input-signals. A first one of the pair will be referred to as a first-differential-input-signal. The other one of the pair will be referred to as a second-differential-input-signal.

The capacitive sampling circuit 330 includes a first-differential-input-terminal 304, which receives the first-differential-input-signal. The capacitive sampling circuit 330 also includes a second-differential-input-terminal 302, which receives the second-differential-input-signal. In this example, the first-differential-input-signal is a negative-differential-input-signal (in_n) and the second-differential-input-signal is a positive-differential-input-signal (in_p). In other examples the polarities of the input signals can be reversed.

The capacitive sampling circuit 330 also includes a capacitive-circuit-output-terminal 305, which provides a sampled-output-signal. In FIGS. 3A and 3B, the capacitive sampling circuit 330 is part of a SAR ADC 300 such that the sampled-output-signal is provided to an input-terminal of a comparator.

The capacitive sampling circuit 330 further includes a plurality of reference-voltage-terminals 332, that are each configured to receive a respective reference-voltage. As discussed above, for a SAR ADC the reference-voltages represent the value of one of the bits in a digital word that is provided as a SAR-logic-feedback-signal.

As shown in FIGS. 3A and 3B, the capacitive sampling circuit 330 includes plurality of first-sampling-capacitors 320, each having a first-plate 334 and a second-plate 336. The first-plates 334 can be considered as the bottom plates, and the second-plates 336 can be considered as the top plates.

A first-capacitor-first-plate-switching-block 326 can selectively connect the first-plate 334 of each of the plurality of first-sampling-capacitors 320 to either: (i) the first-differential-input-terminal 304; or (ii) a respective one of the plurality of reference-voltage-terminals 332. A first-capacitor-second-plate-switch 327 can selectively connect or disconnect the second-plate 336 of each of the plurality of first-sampling-capacitors 320 to the second-differential-input-terminal 302.

In this way, one of the two differential differential-input-signals (in_n and in_p) is sampled on the first-plates (bottom plates) 334 of the first-sampling-capacitors 320, and the other of the two differential differential-input-signals (in_n and in_p) is sampled on the second-plates (top plates) 336 of the first-sampling-capacitors 320. Therefore, both sides of the sampling capacitors 320 can be sampled simultaneously. This can mean that only the differential signal (and no common mode signal) is sampled over the first-sampling-capacitors 320. Therefore, the capacitive sampling circuit 330 of FIGS. 3A and 3B can perform fully differential capacitive sampling, which can advantageously reduce any common mode noise that is sampled across the first-sampling-capacitors 320.

FIG. 3A shows the capacitive sampling circuit 330 in a conversion-state-of-operation, in which:
the first-capacitor-first-plate-switching-block 326 connects the first-plate 334 of each of the plurality of first-sampling-capacitors 320 to a respective one of the plurality of reference-voltage-terminals 332; and
the first-capacitor-second-plate-switch 327 disconnects the second-plate 336 of each of the plurality of first-sampling-capacitors 320 from the second-differential-input-terminal 302.

FIG. 3B shows the capacitive sampling circuit 330 in a sampling-state-of-operation, in which:
the first-capacitor-first-plate-switching-block 326 connects the first-plate 334 of each of the plurality of first-sampling-capacitors 320 to the first-differential-input-terminal 304; and
the first-capacitor-second-plate-switch 327 connects the second-plate 336 of each of the plurality of first-sampling-capacitors 320 to the second-differential-input-terminal 302.

The circuit of FIGS. 3A and 3B can also include a controller (not shown) that controls the first-capacitor-first-plate-switching-block 326 and the first-capacitor-second-plate-switch 327, such that the SAR ADC alternates between the conversion-state-of-operation and the sampling-state-of-operation.

The SAR ADC circuit 300 of FIGS. 3A and 3B also includes a comparator 314, a SAR-logic-block 316, and a plurality of buffers/inverters 318.

The comparator 314 includes a comparator-first-input-terminal and a comparator-output-terminal. In this example, the comparator 314 is used as a single-ended comparator by connecting the first-input-terminal of the comparator 314 to the capacitive sampling circuit 330, and connecting the other input-terminal of the comparator 314 to a fixed reference voltage.

The SAR-logic-block 316 includes a SAR-logic-input-terminal 354 that can receive a comparator-output-signal; and a SAR-logic-feedback-terminal 356 that can provide a SAR-logic-feedback-signal. In the same way as described above, the SAR-logic-feedback-signal is representative of a digital word for supplying as a reference to the first capacitive sampling circuit 330. The SAR-logic-block 316 is configured to process the comparator-output-signal in order to determine the SAR-logic-feedback-signal, as is known in the art. The capacitive sampling circuit 330 can be operated in the way described herein irrespective of any particular switching scheme that is employed by the SAR-logic-block 316.

The SAR-logic-block 316 also includes a SAR-logic-output-terminal 358 that is configured to provide an ADC-output-signal (out_digital) that is representative of the digital word at an end of conversion, again as known in the art.

As shown in FIGS. 3A and 3B, the capacitive-circuit-output-terminal 305 of the first capacitive sampling circuit 330 is connected to the comparator-first-input-terminal of the comparator 314. The comparator-output-terminal of the comparator 314 is connected to the SAR-logic-input-terminal 354. The SAR-logic-feedback-terminal 356 is connected to the plurality of reference-voltage-terminals 332 of the first capacitive sampling circuit 330. As discussed above, each of the plurality of reference-voltage-terminals 332 is configured to receive a respective reference-voltage that represents a bit value of the digital word.

The plurality of buffers 318 are connected in series between the SAR-logic-feedback-terminal 356 and the plurality of reference-voltage-terminals 332 of the first capacitive sampling circuit 330. It will be appreciated from the above description that the capacitive sampling circuit 330 and the plurality of buffers 318 can together be considered as a DAC, which is part of the overall SAR ADC circuit 300.

It will be appreciated that the capacitive sampling circuit 330 shown in FIGS. 3A and 3B can be used in other applications. For example, as part of a DAC, a capacitive charge redistribution SAR ADC, any other appropriate type of ADC, or any circuit that performs capacitive sampling.

Figure 4:
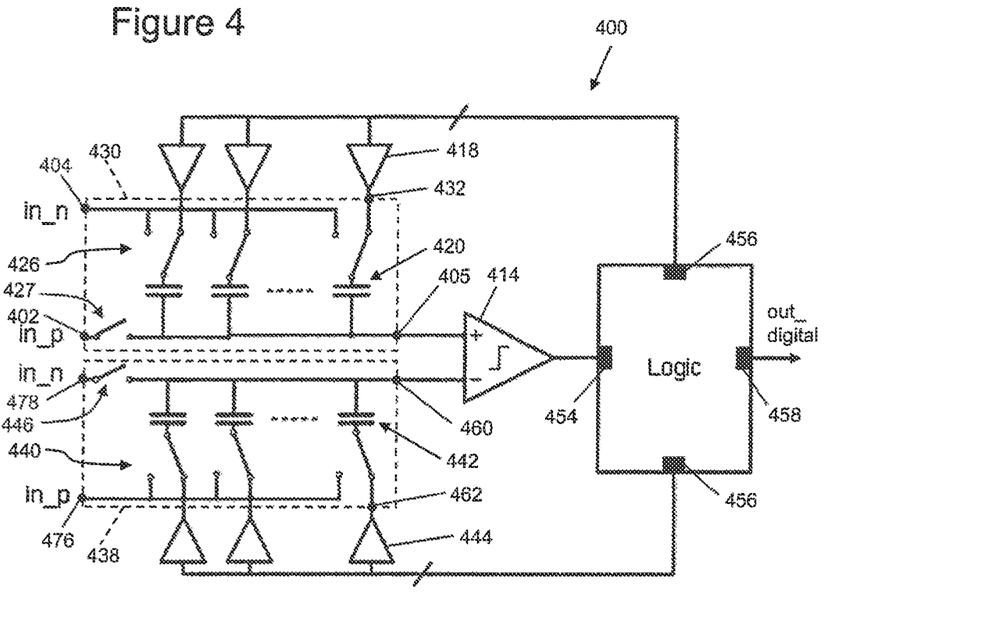
FIG. 4 shows another example embodiment of a SAR ADC, which includes two capacitive sampling circuits.

FIG. 4 shows another example embodiment of a SAR ADC 400. In this example, the SAR ADC includes two capacitive sampling circuits 430, 438. Also, a fully differential comparator 414 is used. As will be discussed below, the load on the two differential-input-signals (in_n and in_p) can be more closely matched than for the circuit of FIGS. 3A and 3B, which results in further improvements to the common mode rejection (CMRR) of the circuit.

The SAR ADC 400 includes a first capacitive sampling circuit 430 and a second capacitive sampling circuit 438. The first capacitive sampling circuit 430 includes: a plurality of first-sampling-capacitors 420; a plurality of reference-voltage-terminals 432; a first-capacitor-first-plate-switching-block 426; and a first-capacitor-second-plate-switch 427. These components are connected in the same way as described above with reference to FIGS. 3A and 3B.

The second capacitive sampling circuit 438 includes: a plurality of second-sampling-capacitors 442; a plurality of reference-voltage-terminals 462; a second-capacitor-first-plate-switching-block 440; and a second-capacitor-second-plate-switch 446. These components are also connected in the same way as described above with reference to FIGS. 3A and 3B.

The first capacitive sampling circuit 430 includes: (i) a first-differential-input-terminal 404 that receives a first-differential-input-signal (in_n); and (ii) a second-differential-input-terminal 402 that receives a second-differential-input-signal (in_p). The second capacitive sampling circuit 438 includes: (i) a first-differential-input-terminal 476 that receives the second-differential-input-signal (in_p); and (ii) a second-differential-input-terminal 478 that receives the first-differential-input-signal (in_n). In this way, a first one of a pair of differential-input signals is connected to the top plates of the first-sampling-capacitors 420 and the bottom plates of the second-sampling-capacitors 442. The other one of the pair of differential-input signals is connected to the bottom plates of the first-sampling-capacitors 420 and the top plates of the second-sampling-capacitors 442. Therefore, the first capacitive sampling circuit 430 (which can be considered as being part of a positive half of the SAR ADC 400) samples the positive input signal on its top plate, and the negative input signal on its bottom plate. For the second-capacitive sampling circuit 438 (which can be considered as being part of a negative half of the SAR ADC 400), this is switched around. Advantageously, this can cancel (or at least reduce) the unbalance of the top and bottom plate connections of the sampling capacitors 420, 442 for the differential input signals (in_n, in_p).

In FIG. 4, the first-differential-input-signal is a negative-differential-input-signal (in_n), and the second-differential-input-signal is a positive-differential-input-signal (in_p). It will be appreciated that in other examples, these signals can be reversed.

The comparator 414 includes a comparator-first-input-terminal (which in this example is a comparator-positive-input-terminal) and a comparator-second-input-terminal (which in this example is a comparator-negative-input-terminal). The comparator-first-input-terminal is connected to a capacitive-circuit-output-terminal 405 of the first capacitive sampling circuit 430. The comparator-second-input-terminal is connected to a capacitive-circuit-output-terminal 460 of the second capacitive sampling circuit 438.

The SAR-logic-feedback-terminal 456 is connected to the plurality of reference-voltage-terminals 432, 462 of both the first and second capacitive sampling circuits 430, 438. As discussed above, each of the plurality of reference-voltage-terminals 432, 462 is configured to receive a respective reference-voltage that represents a bit value of a digital word.

In this example, the SAR ADC 400 also includes a plurality of buffers/inverters 444 that are connected in series between the SAR-logic-feedback-terminal 456 and the plurality of reference-voltage-terminals 462 of the second capacitive sampling circuit 438.

In practice there can be a parasitic capacitance associated with the top plates of the sampling capacitors 420, 442. This can be due to an input capacitance of the comparator 414, for example. Also, in some examples, dummy capacitors can be placed around the sampling capacitors 420, 442 for matching purposes.

Figure 5:
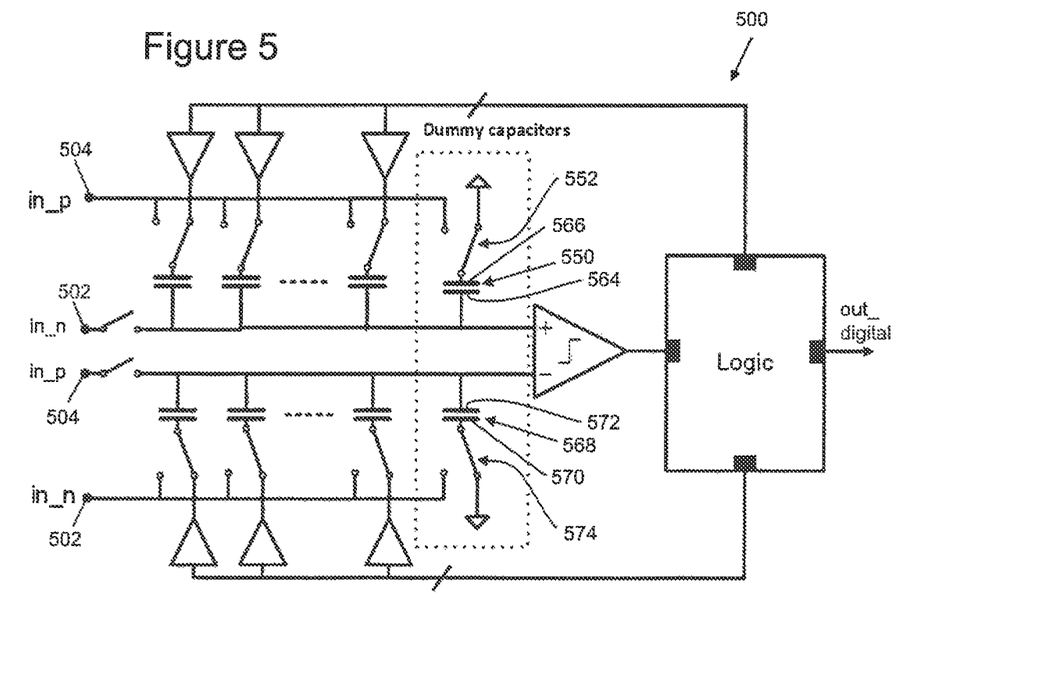
FIG. 5 shows a further still example embodiment of a SAR ADC, which includes one or more dummy capacitors.

FIG. 5 shows another example embodiment of a SAR ADC 500, which includes dummy capacitors 550, 568. Features of FIG. 5 that have already been described with reference to FIG. 4 will be given corresponding features in the 500 series, and will not necessarily be described again here. In FIG. 5, in contrast to FIG. 4, the first-differential-input-terminal 504 receives a positive-differential-input-signal (in_p), and the second-differential-input-terminal 502 receives a negative-differential-input-signal (in_n).

The SAR ADC 500 includes one or more first-dummy-capacitors 550, each having a first-dummy-capacitor-first-plate 566 and a first-dummy-capacitor-second-plate 564. The first-dummy-capacitor-second-plate 564 is connected to the comparator-first-input-terminal. A first-dummy-capacitor-switching-block 552 (which in FIG. 5 is simply a single switch) can selectively connect the first-dummy-capacitor-first-plate 566 of each of the one or more first-dummy-capacitors 550 to either: (i) the first-differential-input-terminal 504; or (ii) a ground-terminal.

When the SAR ADC 500 is in a conversion-state-of-operation (as shown in FIG. 5), the first-dummy-capacitor-switching-block 552 connects the first-dummy-capacitor-first-plate 566 of each of the one or more first-dummy-capacitors 550 to the ground-terminal.

When the SAR ADC 500 is in a sampling-state-of-operation (not shown in FIG. 5), the first-dummy-capacitor-switching-block 552 connects the first-dummy-capacitorfirst-plate 566 of each of the one or more first-dummy-capacitors 550 to the first-differential-input-terminal 504.

Similarly, the SAR ADC 500 includes one or more second-dummy-capacitors 568, each having a second-dummy-capacitor-first-plate 570 and a second-dummy-capacitor-second-plate 572. The second-dummy-capacitor-second-plate 572 is connected to the comparator-second-input-terminal. A second-dummy-capacitor-switching-block 574 (which in FIG. 5 is simply a single switch) can selectively connect the second-dummy-capacitor-first-plate 570 of each of the one or more second-dummy-capacitors 568 to either: (i) the second-differential-input-terminal 502; or (ii) a ground-terminal.

When the SAR ADC 500 is in a conversion-state-of-operation (as shown in FIG. 5), the first-dummy-capacitor-switching-block 552 connects the first-dummy-capacitor-first-plate 566 of each of the one or more first-dummy-capacitors 550 to the ground-terminal.

When the SAR ADC 500 is in a sampling-state-of-operation (not shown in FIG. 5), the first-dummy-capacitor-switching-block 552 connects the first-dummy-capacitor-first-plate 566 of each of the one or more first-dummy-capacitors 550 to the second-differential-input-terminal 502.

Therefore, the dummy capacitors 550, 568 can also use the same sampling scheme as the sampling capacitors. In this way, the parasitic capacitance on the top plate, which can include the illustrated dummy capacitors 552, 568, will not significantly reduce the common-mode rejection.

Other capacitances, such as a comparator input capacitance, can limit the CMRR of the circuit. Such capacitances can be 10% of the main capacitance, which may limit the achievable CMRR to roughly 20 dB for some embodiments. 20 dB can nonetheless be considered as an improvement over a pseudo-differential setup such as the ones of FIGS. 1 and 2.

One or more of the capacitive sampling circuits that are described herein can advantageously allow fully differential sampling on a DAC/sampling capacitor of a SAR ADC in order to increase common mode rejection.

The capacitive sampling circuits described herein, that sample on both sides of the sampling capacitors, are better than circuits that use opamp based input buffers. This is because opamp based input buffers can be power hungry, add distortion/noise and can be slow.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An SAR ADC circuit that comprises:
    a first capacitive sampling circuit comprising
        a first-differential-input-terminal, configured to receive a first one of a pair of differential-input-signals,
        a second-differential-input-terminal, configured to receive the other one of the pair of differential-input-signals,
        a capacitive-circuit-output-terminal, configured to provide a sampled-output-signal,
        a plurality of first-sampling-capacitors, each having a first-plate and a second-plate,
        a plurality of reference-voltage-terminals, each configured to receive a respective reference-voltage,
        a first-capacitor-first-plate-switching-block configured to selectively connect the first-plate of each of the plurality of first-sampling-capacitors to either (i) the first-differential-input-terminal or (ii) a respective one of the plurality of reference-voltage-terminals, and
        a first-capacitor-second-plate-switch, configured to selectively connect or disconnect the second-plate of each of the plurality of first-sampling-capacitors to the second-differential-input-terminal;
    a comparator comprising a comparator-first-input-terminal and a comparator-output-terminal; and
    a SAR-logic-block comprising
        a SAR-logic-input-terminal that is configured to receive a comparator-output-signal, a SAR-logic-feedback-terminal that is configured to provide a SAR-logic-feedback-signal that is representative of a digital word for supplying as a reference to the first capacitive sampling circuit, wherein the digital word comprises a plurality of bits, wherein the SAR-logic-block is configured to process the comparator-output-signal in order to determine the SAR-logic-feedback-signal, and a SAR-logic-output-terminal that is configured to provide an ADC-output-signal that is representative of the digital word at an end of conversion;

wherein:
the capacitive-circuit-output-terminal of the first capacitive sampling circuit is connected to the comparator-first-input-terminal of the comparator;
the comparator-output-terminal of the comparator is connected to the SAR-logic-input-terminal; and
the SAR-logic-feedback-terminal is connected to the plurality of reference-voltage-terminals of the first capacitive sampling circuit, wherein each of the plurality of reference-voltage-terminals is configured to receive a respective reference-voltage that represents the value of one of the bits in the digital word.

2. The SAR ADC circuit of claim 1, further comprising a controller configured to control the first-capacitor-first-plate-switching-block and the first-capacitor-second-plate-switch, in order to alternate between:
   (a) a sampling-state-of-operation, in which:
      the first-capacitor-first-plate-switching-block connects the first-plate of each of the plurality of first-sampling-capacitors to the first-differential-input-terminal; and
      the first-capacitor-second-plate-switch connects the second-plate of each of the plurality of first-sampling-capacitors to the second-differential-input-terminal; and
   (b) a conversion-state-of-operation, in which:
      the first-capacitor-first-plate-switching-block connects the first-plate of each of the plurality of first-sampling-capacitors to a respective one of the plurality of reference-voltage-terminals; and
      the first-capacitor-second-plate-switch disconnects the second-plate of each of the plurality of first-sampling-capacitors from the second-differential-input-terminal.

3. The SAR ADC circuit of claim 1, wherein the circuit is a digital-to-analogue converter circuit.

4. The SAR ADC circuit of claim 1, wherein the circuit is an analogue-to-digital converter circuit.

5. The SAR ADC circuit of claim 1, further comprising:
a plurality of buffers that are connected in series between the SAR-logic-feedback-terminal and the plurality of reference-voltage-terminals of the first capacitive sampling circuit.

6. The SAR ADC circuit of claim 1, further comprising:
one or more first-dummy-capacitors, each having a first-dummy-capacitor-first-plate and a first-dummy-capacitor-second-plate, wherein the first-dummy-capacitor-second-plate is connected to the comparator-first-input-terminal; and
a first-dummy-capacitor-switching-block configured to selectively connect the first-dummy-capacitor-first-plate of each of the one or more first-dummy-capacitors to either: (i) the first-differential-input-terminal; or (ii) a ground-terminal.

7. The SAR ADC circuit of claim 6, wherein:
when the circuit is in a conversion-state-of-operation, the first-dummy-capacitor-switching-block connects the first-dummy-capacitor-first-plate of each of the one or more first-dummy-capacitors to the ground-terminal; and
when the circuit is in a sampling-state-of-operation, the first-dummy-capacitor-switching-block connects the first-dummy-capacitor-first-plate of each of the one or more first-dummy-capacitors to the first-differential-input-terminal.

8. The SAR ADC circuit of claim 1, further comprising:
a second capacitive sampling circuit comprising the capacitive sampling circuit;
wherein:
the first-differential-input-terminal of the first capacitive sampling circuit is configured to receive a first-differential-input-signal;
the second-differential-input-terminal of the first capacitive sampling circuit is configured to receive a second-differential-input-signal;
the first-differential-input-terminal of the second capacitive sampling circuit is configured to receive the second-differential-input-signal;
the second-differential-input-terminal of the second capacitive sampling circuit is configured to receive the first-differential-input-signal;
the comparator further comprises a comparator-second-input-terminal;
the capacitive-circuit-output-terminal of the second capacitive sampling circuit is connected to the comparator-second-input-terminal of the comparator; and
the SAR-logic-feedback-terminal is connected to the plurality of reference-voltage-terminals of the second capacitive sampling circuit, wherein each of the plurality of reference-voltage-terminals is configured to receive a respective reference-voltage that represents the value of one of the bits in the digital word.

9. The SAR ADC circuit of claim 8, further comprising:
a plurality of buffers that are connected in series between the SAR-logic-feedback-terminal and the plurality of reference-voltage-terminals of the second capacitive sampling circuit.

10. The SAR ADC circuit of claim 8, further comprising:
one or more second-dummy-capacitors, each having a second-dummy-capacitor-first-plate and a second-dummy-capacitor-second-plate, wherein the second-dummy-capacitor-second-plate is connected to the comparator-second-input-terminal; and
a second-dummy-capacitor-switching-block configured to selectively connect the second-dummy-capacitor-first-plate of each of the one or more second-dummy-capacitors to either: (i) the second-differential-input-terminal; or (ii) a ground-terminal.

11. The SAR ADC circuit of claim 10, wherein:
when the SAR ADC is in a conversion-state-of-operation, the second-dummy-capacitor-switching-block connects the second-dummy-capacitor-first-plate of each of the one or more second-dummy-capacitors to the ground-terminal; and
when the SAR ADC is in a sampling-state-of-operation, the second-dummy-capacitor-switching-block connects the second-dummy-capacitor-first-plate of each of the one or more second-dummy-capacitors to the second-differential-input-terminal.

12. The SAR ADC circuit of claim 1, wherein the first-differential-input-signal is a positive-differential-input-signal; and the second-differential-input-signal is a negative-differential-input-signal.

13. The SAR ADC circuit of claim 1, wherein the first-differential-input-signal is a negative-differential-input-signal; and the second-differential-input-signal is a positive-differential-input-signal.

* * * * *